United States Patent [19]

Lelandais et al.

[11] Patent Number: 5,107,505
[45] Date of Patent: Apr. 21, 1992

[54] CIRCUIT OF ENCODING AND FORMATTING DATA FOR ROTATING HEAD RECORDERS

[75] Inventors: Guy Lelandais, Gif-sur-Yvette; Xavier Denoize, Limours, both of France

[73] Assignee: Schlumberger Industries, Montrouge, France

[21] Appl. No.: 376,101

[22] Filed: Jul. 6, 1989

[30] Foreign Application Priority Data

Jul. 7, 1988 [FR] France .................. 88 09234

[51] Int. Cl.⁵ .............................................. G06F 11/10
[52] U.S. Cl. .................................. 371/37.4; 371/37.6; 371/50.1
[58] Field of Search .............. 371/37.4, 37.5, 50.1, 371/37.6

[56] References Cited

U.S. PATENT DOCUMENTS

| | | | |
|---|---|---|---|
| 4,336,612 | 6/1982 | Inoue et al. | 371/37.4 |
| 4,365,332 | 12/1982 | Rice | 371/50.1 X |
| 4,398,292 | 8/1983 | Doi et al. | 371/37.4 |
| 4,602,383 | 7/1986 | Ogawa et al. | 358/261.3 X |
| 4,607,367 | 8/1986 | Ive et al. | 371/37.4 |
| 4,719,628 | 1/1988 | Ozaki et al. | 371/37.4 |
| 4,769,819 | 9/1988 | Matsutani et al. | 371/37.4 |

Primary Examiner—Jerry Smith
Assistant Examiner—Allen M. Lo
Attorney, Agent, or Firm—Sanford J. Asman

[57] ABSTRACT

A circuit for encoding and formatting data, the circuit having an input suitable for receiving a data stream in the form of bytes, the circuit comprising firstly a working memory in which the data is stored in the form of a matrix, and from which the data is taken sequentially, with the data being stored and taken by means of respective different sequences (either by being stored in lines and then taken in columns, or else by being stored in columns and then taken in lines), and secondly first and second encoder means each suitable for calculating, respectively for each line and for each column, a given number of redundancy bytes which are respectively horizontal redundancy bytes and vertical redundancy bytes (with one of said encoding means being connected to the outlet of said memory), wherein the first and second encoding means are connected in parallel to the output from the memory, with said second encoding means (for performing redundancy calculations corresponding to the sequence opposite to that by which the data is taken from the memory) being suitable for storing intermediate results in the calculations performed thereby.

7 Claims, 3 Drawing Sheets

CIRCUIT OF ENCODING AND FORMATTING DATA FOR ROTATING HEAD RECORDERS

The present invention relates to an electronic circuit for processing data delivered in the form of a stream of bytes from transmitter means, e.g. such as physical parameter sensors or control and/or regulation apparatuses (as may be embarked on an aircraft, for example), said data being intended to be recorded on a data medium such as a magnetic tape.

BACKGROUND OF THE INVENTION

So-called "rotating head" recorders to which the circuit of the invention applies comprise a cylindrical drum around which the tape is wound helically at a given helix angle, a rotary disk coaxial with the drum and disposed in an equatorial slot, and magnetic heads fixed to the periphery of the disk to project slightly from the surface of the drum so as to bear against the tape. Given the linear displacement of the tape and the rotation of the heads, data is recorded on the tape in sloping track segments, referred to as "frames" by the person skilled in the art. The frames are made up in a given format (slope, number of bits) and also include identification and synchronization data.

The electrical circuit of the invention has its input connected to said transmitter means and has its output connected to a magnetic recording head in contact with the magnetic tape, and is intended firstly to format the data to enable it to be recorded on the tape in a given format, and secondly to encode the data in order to provide error correction.

To this end, the data is stored temporarily in conventional manner in working memory (in the form of a matrix). Encoding is performed by using mathematical operations (known per se, e.g. of the Reed-Solomon code type) for calculating respective redundancy bytes for each line and for each column. Thus, for example, for a matrix of 118 lines by 153 columns, the 118 bytes of each column have ten vertical redundancy bytes associated therewith, and the 153 bytes of each line have 8 horizontal redundancy bytes associated therewith.

The bytes from the data transmitter means are stored column by column one after another in the matrix memory, and they are then removed therefrom line-by-line in order to be recorded on the tape in a given frame configuration.

Encoding performed in this way makes it possible to detect or correct (by decoding) data that is erroneous or lost due to a failure by the recorder and/or to local defects on the tape. By writing the data into the memory in columns and then reading it out in lines, the effects of several consecutive wrong bytes are minimized. It will be understood that the greater the number of redundancy bytes, the better the error correction, but also the longer the time required for encoding the data.

A prior art circuit of this type is shown in block form in FIG. 2 and comprises, in succession: a first encoding circuit 1 for performing vertical encoding (calculating vertical redundancy bytes); working memory 2 in which the bytes are stored in the form of a matrix; a second encoding circuit 3 for performing horizontal encoding (calculating horizontal redundancy bytes); and a data formatting and synchronization circuit "S" whose output is connected to a magnetic head "T".

The memory 2 receives the data bytes together with the vertical redundancy bytes as calculated by the first encoding circuit 1 on a column-by-column basis; these bytes are then extracted (or read) from the memory 2 line-by-line and injected into the second encoding circuit 3 which calculates the horizontal redundancy bytes. At its output, the second encoding circuit 3 delivers both the horizontal redundancy bytes and the contents of the memory 2. The entire set of data bytes, vertical redundancy bytes, and horizontal redundancy bytes is then processed by the circuit S prior to being recorded on the tape by the magnetic head T.

This prior circuit suffers from drawbacks.

Assume that the data stream arriving at the vertical encoder circuit 1 has a frequency "f", then the output stream from the circuit 1 has a frequency $f_1 = f \cdot (118+10)/118$ (for a 118 line matrix having 10 vertical redundancy bytes); $f_1$ is greater than f. Consequently, a data compression circuit 4 is provided upstream from the first encoding circuit 1 in order to contrive periodic "blank" time intervals for containing the calculated vertical redundancy bytes. Similarly, the horizontal encoder circuit 3 receives a data stream of frequency $f_1$ at its input while its output delivers a stream at frequency $f_2 = f \cdot (118+10)/118 \times (153+8)/153$, giving $f_2$ greater than $f_1$. The memory 2 also serves to make the frequency change from $f_1$ to $f_2$ possible and this function may be thought of as being provided by a virtual second data compression circuit 5 integrated within the memory 2. Such "data compression" circuits are better known from the abbreviation FIFO (for first-in first-out buffer memory).

The need to provide such data compression circuits complicates the formatting circuit overall.

In addition, it follows from the above, that the vertical encoder circuit processes data at a frequency which is different from that of the horizontal encoder circuit. This further increases the complexity of implementing these two circuits.

Furthermore, the trend in the recording technology with which this type of circuit is used is towards ever higher data rates, e.g. several hundred megabit/s and even one gigabit/s.

Given the frequency difference (associated with the data rate) between the input and the output of the first encoding circuit, the first encoding circuit imposes an upper limit on operating frequency which is lower than that required (as mentioned above). In order to reach the required frequencies, it might be assumed that multiple input channels could be provided so as to enable the encoding circuit to process data in parallel. However, this would be possible only at the cost of increasing the complexity of the first encoder circuit. In any event, electronic technology imposes a limit as to the number of bytes which can be processed in parallel.

The invention seeks to remedy this drawback and proposes a circuit for encoding and formatting data, which circuit is simple in structure and operation, and is suitable for operating at high data rate values.

SUMMARY OF THE INVENTION

To this end, the present invention provides a circuit for encoding and formatting data, the circuit having an input suitable for receiving a data stream in the form of bytes, the circuit comprising firstly a working memory in which the data is stored in the form of a matrix, and from which the data is taken sequentially, with the data being stored and taken by means of respective different sequences (either by being stored in lines and then taken in columns, or else by being stored in columns and then taken in lines), and secondly first and second encoder means each suitable for calculating, respectively for each line and for each column, a given number of redundancy bytes which are respectively horizontal redundancy bytes and vertical redundancy bytes (with one of said encoding means being connected to the outlet of said memory), wherein the first and second encoding means are connected in parallel to the output from the memory, with said second encoding means (for performing redundancy calculations corresponding to the sequence opposite to that by which the data is taken from the memory) being suitable for storing intermediate results in the calculations performed thereby.

The above-mentioned advantages of the invention are combined with that of being able to implement the two encoding circuits in a single electronic assembly.

In a preferred embodiment, the second encoding means comprises a second encoding circuit and an associated additional memory.

In a variant, the second encoding means is constituted by a plurality of encoding circuits equal to the number of lines (or columns) of the memory matrix.

In order to enable high data rates to be processed, the circuit includes at least two modular assemblies each including a memory whose output is connected to two encoding circuits in parallel, with each pair of encoding circuits being connected to the output of each memory.

BRIEF DESCRIPTION OF THE DRAWINGS

Embodiments of the invention are described by way of example with reference to the accompanying drawings, in which.

DETAILED DESCRIPTION

The invention is applicable to encoding and formatting data constituted by a stream of data in the form of bits grouped in 8-bit bytes, coming from measurement or control devices, or the like, and intended to be recorded (e.g. on a tape). The data stream may be continuous or discontinous (i.e. in "packets"). In conventional manner, the data is encoded for error correction purposes by giving each line and each column respective numbers of redundancy bytes calculated by mathematical operations which are known per se (e.g. of the Reed-Solomon code type). The bytes are stored in working memory column-by-column, and then read (or taken) from the memory line-by-line.

Figure 1:
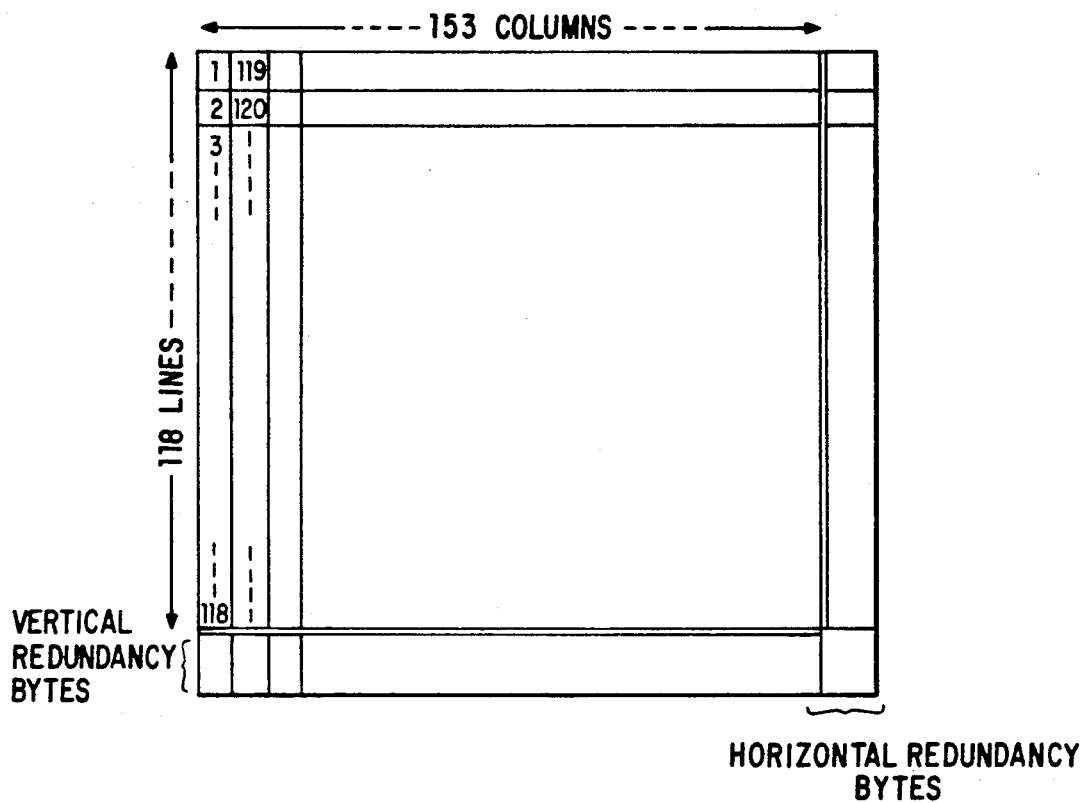
FIG. 1 is a diagram of a matrix comprising both data and redundancy bytes.

FIG. 1 is a diagram of a memory in the form of a matrix comprising 118 lines and 153 columns of data bytes referenced 1, 2, 3, . . . , 118, 119, 120, . . . . Each column has ten vertical redundancy bytes associated therewith, and each line has eight horizontal redundancy bytes associated therewith. Thus, a full set of bytes comprising both data per se and redundancy bytes (both vertical and horizontal) constitutes a matrix of 118+10 lines by 153+8 columns.

Figure 2:
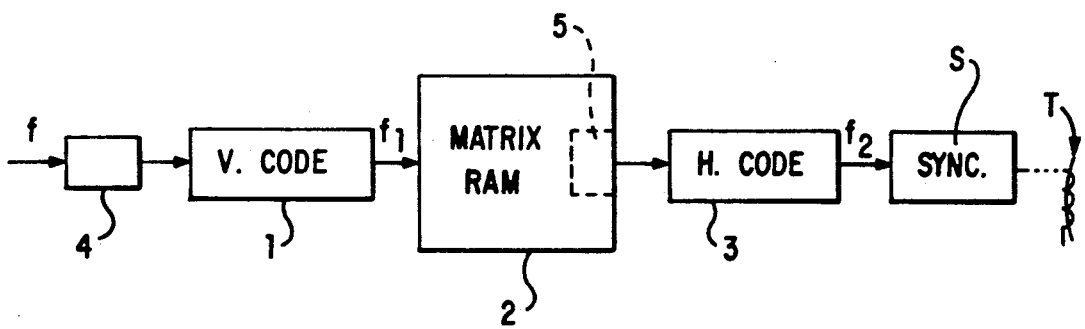
FIG. 2 is a block diagram of a prior art circuit.

FIG. 2 is a block diagram of a prior art circuit, as described above.

Figure 3:
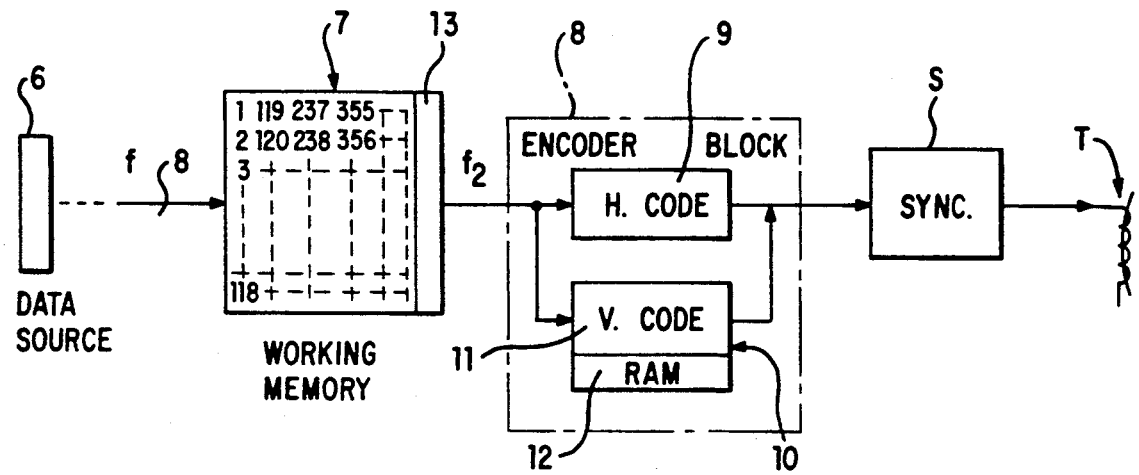
FIG. 3 is a block diagram of a circuit in accordance with the invention.

An embodiment of the circuit of the invention is shown in block diagram form in FIG. 3.

This circuit is connected to conventional means 6 for transmitting data, and it comprises a working memory 7 in which bytes are stored column-by-column in matrix form and having an outlet connected to a functional encoding block 8. This block 8 includes first encoding means 9 and second encoding means 10 connected in parallel with each other. The first encoding means are used for calculating the horizontal redundancy bytes and are constituted by a first encoding circuit 9 referred to below as the horizontal encoding circuit 9. The second encoding means 10 are used for calculating the vertical redundancy bytes, and are constituted by a second encoding circuit 11 (referred to below as the vertical encoding circuit 11) together with an auxiliary memory 12 of the same type as the memory 7, but smaller in size.

The memory 7 is designed so as to allow frequency to be changed from the frequency "f" of the input data stream to the memory 7 to a frequency $f_2$ at the output from the memory, where $f_2 = f.(118+10)/118 \times (153 \times 8)/153$. To this end, the memory 7 may be considered as being provided with a virtual data compression circuit 13 (or FIFO circuit), integrated therein, of the type described above, and known per se.

Thus, as bytes are extracted line-by-line from the memory 7, the horizontal and vertical encoding circuits 9 and 11 calculate the horizontal and vertical redundancy bytes respectively and in parallel. For a byte matrix constituting the data per se, in 118 lines by 153 columns, the first line of the memory 7 comprises successive bytes numbered 1, 119, 237, 355, . . . , in FIG. 3. These bytes are taken from the memory and applied simultaneously both to the horizontal encoding circuit 9 which calculates the horizontal redundancy bytes relating to the first line, and also the vertical encoding circuit 10 which stores the bytes it receives in the auxiliary memory 12. The horizontal encoding circuit 9 delivers the set of bytes 1, 119, . . . , plus the 8 horizontal redundancy bytes.

The bytes in the next line (bytes 2, 120, 238, 356, . . . ) are then taken from the memory 7 and received simultaneously by the horizontal encoder 9 which calculates the horizontal redundancy bytes related to the second line, and also by the vertical encoder. As the bytes of the second line arrive, the vertical encoder performs partial vertical redundancy byte calculations and stores intermediate results in the auxiliary memory 12 (byte 2 combined with byte 1 for partial calculation of the vertical redundancy bytes in column 1; and similarly 119 with byte 120 for the second column; then byte 237 and byte 238 for the third column).

At the end of this second stage (when the first line has been taken), the horizontal encoder 9 delivers data bytes 2, 120, 238, 356, . . . ) and the horizontal redundancy bytes, while the auxiliary memory 12 of the vertical encoder 10 contains partial results of calculations for the vertical redundancy bytes.

Stages follow one another in this way line-by-line until all of the bytes have been taken from the memory. It should be observed that in the present case, writing data into the memory and reading data are simultaneous operations.

The auxiliary memory 12 is shown and described as being associated with the vertical encoding circuit 10. This corresponds to the special case of bytes being taken from the memory line-by-line. More generally, the auxiliary memory 12 is associated with that one of the encoding circuits which calculates the redundancy bytes corresponding to the sequence (i.e. line or column) that is not used for taking the bytes from the memory.

The invention has advantages over the prior art.

No specific data compression circuit (FIFO) is required since the function of changing frequency is integrated in the memory. This simplifies implementation considerably.

In addition, both the horizontal and the vertical encoding circuits 9 and 11 operate at the same frequency and they are close to each other. Such functional and physical closeness makes it possible to implement the encoding assembly 8 as a single electronic assembly, thereby obtaining advantages of simplification, compactness, and reduced cost.

Finally, and above all, the circuit of the invention can process data transmitted at high rates (in bits per second). In order to increase the maximum data rate that can be processed, several modular assemblies of the type shown in FIG. 3 are connected in parallel. Since each such modular assembly is capable of processing data at a rate of several tens of Mbit/s, e.g. 30 Mbit/s, this number can be multiplied by the number of assemblies connected in parallel.

Figure 4:
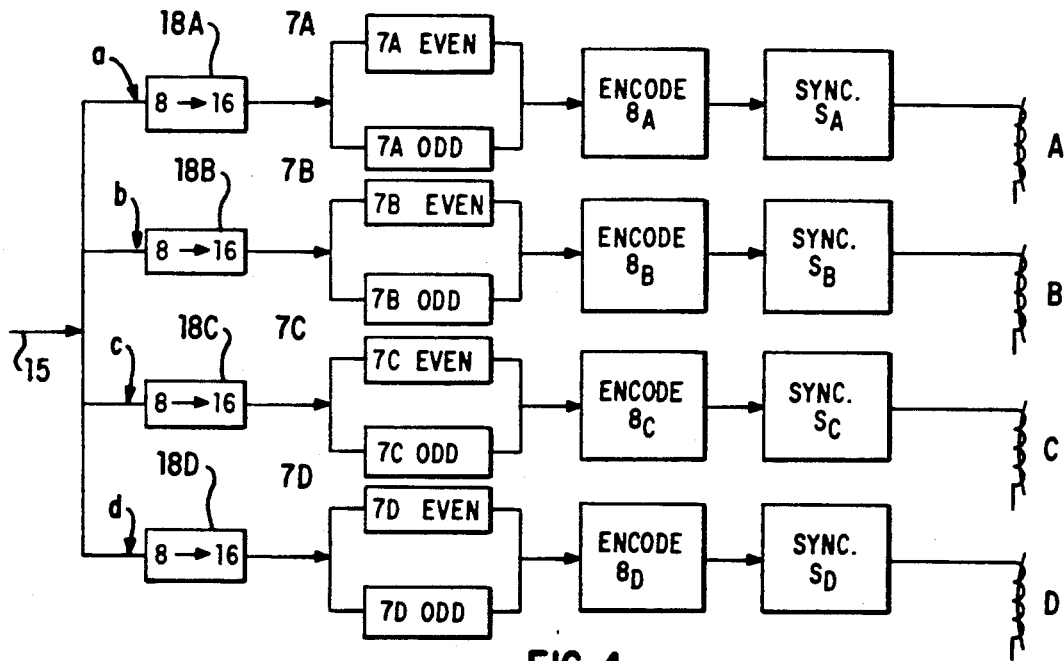
FIG. 4 is a block diagram of a circuit in accordance with the invention provided with four FIG. 3 assemblies connected in parallel.

One such circuit having four FIG. 3 modular assemblies is shown in FIG. 4.

The circuit comprises a line 15 receiving the data stream and splitting into four paths a, b, c, and d leading to respective magnetic heads A, B, C, and D, with each path comprising, in succession, a circuit 18, a memory 7, an encoding assembly 8, and synchronizing means. The data rate which can be processed by putting four FIG. 3 assemblies in parallel is theoretically 30 Mbit/s × 4 = 120 Mbit/s.

For technological reasons, the data rate is limited by the maximum operating frequency of the memories, and in the present case that is about 15 MHz, which corresponds to 15 megabytes per second. Each byte contain 8 bits, and thus 120 Mbit/s = 15 Mbyte/s.

Twice the data rate, i.e. 240 Mbit/s, would require a frequency of 30 MHz which is incompatible with the operating limits of the memories. However, a data rate of 240 Mbit/s can be obtained using the circuit of FIG. 4 by virtue of the means referenced 18A, 18B, 18C, and 18D (disposed respectively on paths a, b, c, and d) suitable for transforming 8-bit bytes into 16-bit words. Thus, a data rate of 240 Mbit/s corresponds to 15 Mwords per second, with each word having 16 bits and with memory operating a frequency of 15 MHz. This means that each path requires two memories referred to as even and odd, connected in parallel and processing even and odd bytes respectively. Each of the memories 7A, 7B, 7C, and 7D is constituted by two memories in parallel, namely 7A even and 7A odd for path a, 7B even and 7B odd for path b, 7C even and 7C odd for path c, and 7D odd and 7D even for path d.

Figure 5:
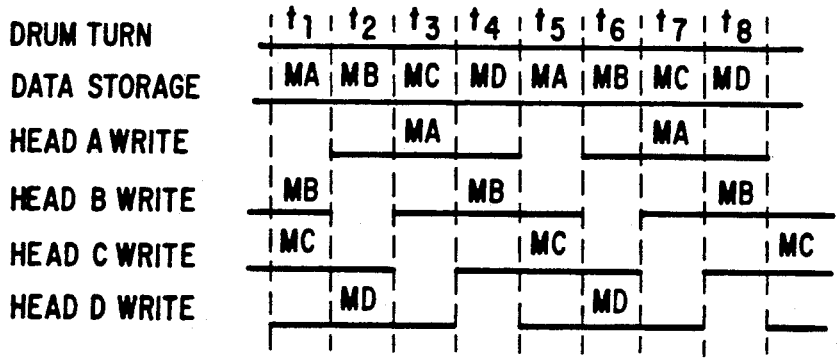
FIG. 5 is a timing diagram relating to the operation of the circuit shown in FIG. 4.

FIG. 5 is a timing diagram showing the operating periods of the memories (data storage) and of the heads (reproduction on the tape by the corresponding head). The heads rotate around the drum in four equal periods $t_1$ to $t_4$, and then $t_5$ to $t_8$. During $t_1$ data is stored in memory 7A while data is being taken from memories 7B, 7C, and 7D and is being transmitted to heads B, C, and D for writing on the tape. In like manner, during each of the following periods data is written into one of the memories while the other three memories are being read.

The invention also presents other characteristics, described below with reference to FIG. 6, enabling the data rate that can be processed to be increased further using simple means.

With the circuit shown in FIG. 4, which is capable of processing at a rate of 240 Mbit/s, double rate processing (480 Mbit/s), requires eight paths (similar to paths a, b, c, and d of FIG. 4) each terminating at a corresponding head, with the circuits 18 then being suitable for transforming 8-bit bytes into 32-bit words. The above-mentioned memory operating limit of 15 MHz then requires four memories to be provided in parallel instead of the two memories provided in parallel in FIG. 4.

The circuit that would be obtained in this way, although indeed suitable for operating at twice the data rate of the circuit shown in FIG. 4, would nevertheless suffer from drawbacks. Each of the four memories on any one path would contain a frame, i.e. $2 \times (153 \times 118)$ bytes, in other words each memory would be required to store half as many bytes as in FIG. 4. This would lead either to using memories of smaller capacity but occupying the same bulk as in FIG. 4, or else to using memories of the same capacity as those of FIG. 4, but only using them at half capacity.

Neither of these solutions is satisfactory.

Figure 6:
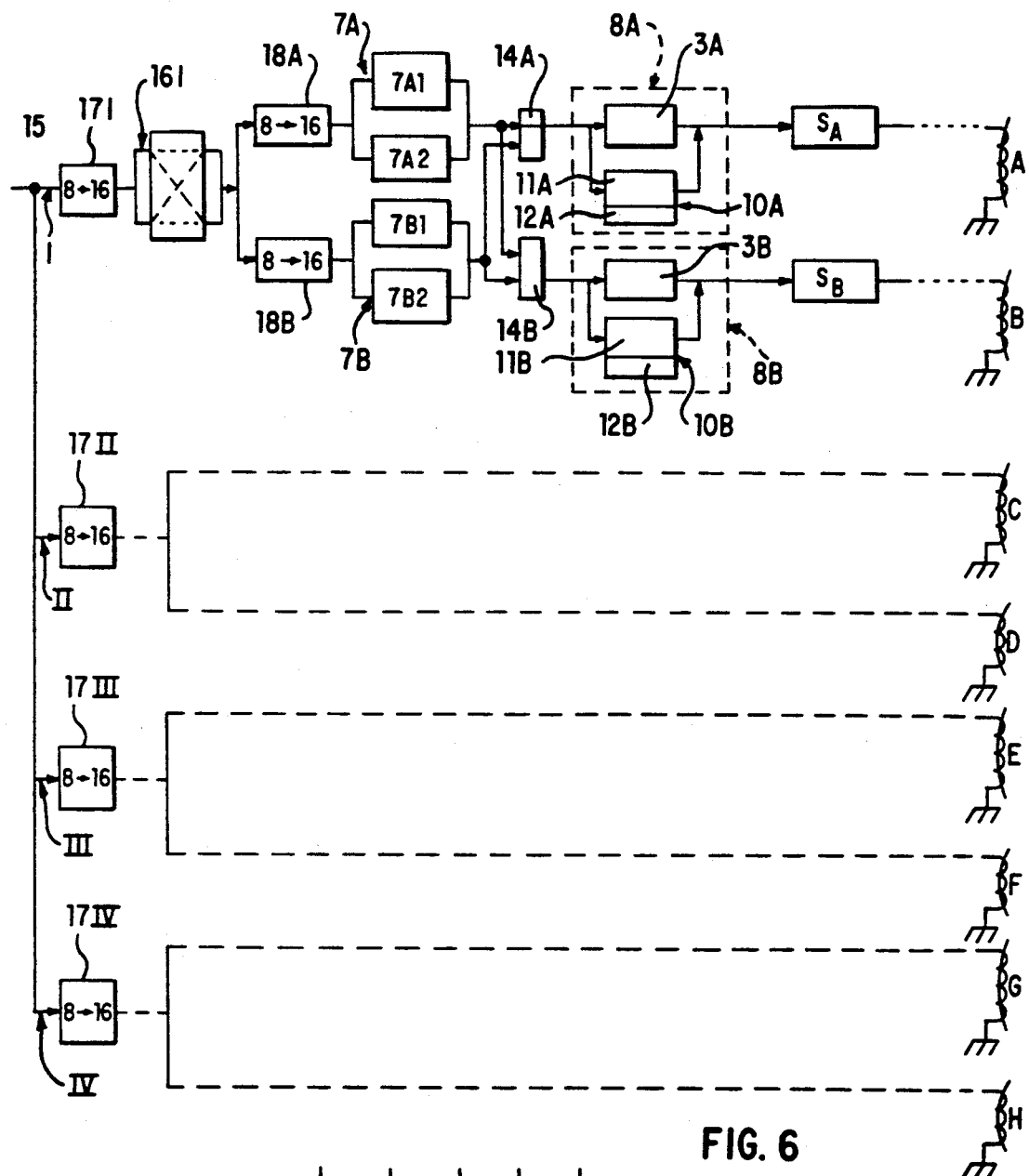
FIG. 6 is a block diagram of an improved variant of a circuit in accordance with the invention suitable for processing data at a high rate.

The circuit of the invention as shown in FIG. 6 solves this drawback.

The circuit has a line 15 providing data at a rate of 480 Mbit/s, this line is split into four sublines, I, II, III, and IV each subsequently split into two paths. Each line I, II, III, and IV comprises an 8-to-16 bit transforming circuit given reference 17I, 17II, 17III, or 17IV as the case may be. Items which are similar in FIGS. 3 and 6 bear the same references, and in FIG. 6 items disposed on path a are given index A, and items disposed on path b are given index B.

Each path comprises in succession: an 8 bit to 16 bit transforming circuit given reference 18A or 18B, a working memory 7A or 7B, a multiplexer 14A or 14B, and an encoding assembly 8A or 8B. The output from each memory 7A or 7B is connected via a respective multiplexer 14A or 14B to the inputs of both encoding assemblies. For reasons of clarity, only paths a and b have been drawn in full.

Instead of having a one-to-one relationship between each head and a particular set of memories, as in the FIG. 4 circuit, the circuit shown in FIG. 6 operates in such a manner that paths are coupled together in pairs, with pairs of encoding assemblies (8A and 8B) thus operating in parallel.

Each pair of memories (71A, 7A2 or 7B1, 7B2) in a path is suitable for storing one frame; the two pairs of memories on a given subpath can store a total of two frames.

Bytes are paired as follows 1-2, 3-4, 5-6, etc., with odd and even pairs being sent over respective A and B paths.

Figure 7:
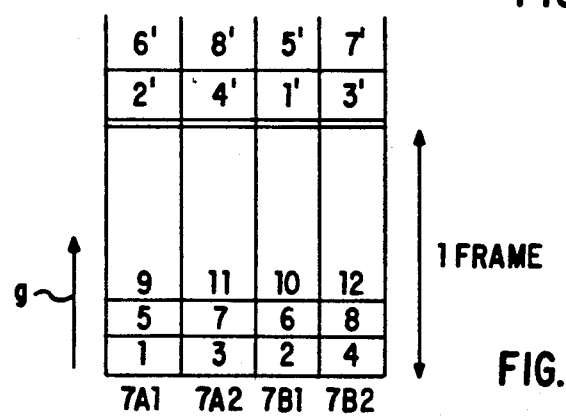
FIG. 7 is a diagram showing the writing of data in the four memories associated with the A and B paths of the FIG. 6 circuit.

Memory 7A1 stores bytes 1, 5, 9, etc.: memory 7A2 stores bytes 3, 7, 11, etc.: memory 7B1 stores bytes 2, 6, 10, etc.; and memory 7B2 stores bytes 4, 8, 12, etc. FIG. 7 is a diagram showing how the bytes are written to memory with arrow g showing the direction in which writing takes place as a function of time.

Once a number of bytes corresponding to an entire frame (2×153×118) has been stored in the four memories, switchover means 161 interchange the switching between memory pairs 7A1, 7A2 and 7B1, 7B2. This switchover takes place immediately before writing the first byte to the second frame. Thus, as shown in FIG. 7, the first byte of the second frame actually stored in memory 7A1 is byte 2' (i.e. the byte which occurs chronologically second in the second frame).

This prevents the encoding assemblies from reading same order bytes (first, second, etc.) from the same memory in two consecutive frames.

Variants of the invention are possible. In the embodiments shown in the figures and described above, the second encoding means 11 is constituted by an encoding circuit 10 and an auxiliary memory 12. In a variant, the second encoding means 11 (the vertical encoding means) could be constituted by a plurality of encoding circuits 10i (for i=1 to n) disposed in parallel with each other and where the number "n" is equal to the number of columns. As a result, each encoding circuit 10i would calculate vertical redundancy bytes for a respective column in time with the bytes being taken from the memory on a line-by-line basis (as described above).

We claim:

1. A circuit for encoding and formatting data, the circuit having an input suitable for receiving a data stream in the form of bytes and an output for delivering an encoded data stream, the circuit comprising:

(a) a working memory connected to said input in which said data are stored in the form of a matrix, and from which said data is taken sequentially, with said data being stored and taken by means of respective different sequences;

(b) first and second encoder means connected in parallel between said working memory and said output, each of said encoder means being suitable for calculating, respectively for each line and for each column of said matrix, a given number of redundancy bytes which are, respectively, horizontal and vertical redundancy bytes, said second encoding means being suitable for storing intermediate results in the calculations performed thereby.

2. The circuit of claim 1, wherein said second encoding means comprises a second encoding circuit associated with additional memory.

3. The circuit of claim 1, wherein said second encoding means is constituted by a plurality of encoding circuits, with the number of encoding circuits being equal to the number of lines (or columns as the case may be) in said memory matrix.

4. The circuit of claim 1, comprising at least two paths, each path terminating at a corresponding magnetic head, each path including a memory connected to first and second encoding means.

5. The circuit of claim 4, wherein each path is connected to a magnetic head and comprises a pair of memories whose output is connected to said first and second encoding means in parallel, with the output from the memory pair in a given path being connected via a multiplexing circuit to said input of said first and second encoding means of the other path, said circuit also being provided with switching means disposed upstream from the memories and suitable for interchanging the order in which data is written into said memory pairs.

6. The circuit of claim 1, wherein the output from said first and second parallel-connected encoding means is connected to a magnetic head via synchronization means.

7. The circuit of claim 1, wherein said first and second encoding means are implemented in a single electronic assembly.

* * * * *